(12) United States Patent
Bowlds

(10) Patent No.: US 7,239,133 B1
(45) Date of Patent: Jul. 3, 2007

(54) METHODS AND SYSTEMS FOR CONTROLLING THE TEMPERATURE STABILITY OF AN INDUCTOR

(75) Inventor: Brian Burket Bowlds, Minden, NV (US)

(73) Assignee: General Electric Company, Schenectady, NY (US)

( * ) Notice: Subject to any disclaimer, the term of this patent is extended or adjusted under 35 U.S.C. 154(b) by 4 days.

(21) Appl. No.: 11/335,201

(22) Filed: Jan. 19, 2006

(51) Int. Cl.
*G01B 7/14* (2006.01)

(52) U.S. Cl. .................... 324/207.26; 324/207.12; 324/207.16; 324/225; 324/236

(58) Field of Classification Search .......... 324/207.12, 324/207.16, 207.26, 225, 234, 235, 239; 336/179
See application file for complete search history.

(56) References Cited

U.S. PATENT DOCUMENTS

| | | |
|---|---|---|
| 3,471,815 A | 10/1969 | Grant et al. |
| 3,564,392 A | 2/1971 | Scully |
| 3,634,799 A | 1/1972 | Strauch |
| 3,694,785 A | 9/1972 | Chass |
| 3,750,010 A | 7/1973 | Abnett et al. |
| 3,939,403 A | 2/1976 | Stassart |
| 3,992,690 A | 11/1976 | Sperr, Jr. |
| 3,996,510 A | 12/1976 | Guichard |
| 4,214,483 A | 7/1980 | Young |
| 4,267,508 A | 5/1981 | Ando |
| 4,598,260 A | 7/1986 | Carr |
| 4,651,094 A | 3/1987 | Wallace |
| 4,652,822 A | 3/1987 | Wallace |
| 4,857,842 A | 8/1989 | Sturman et al. |
| 4,926,123 A | 5/1990 | Redlich |
| 5,027,180 A | 6/1991 | Nishizawa et al. |
| 5,089,930 A | 2/1992 | Chass |
| 5,115,193 A | 5/1992 | Bean et al. |
| 5,126,664 A | 6/1992 | Howard |
| 5,270,645 A | 12/1993 | Wheeler et al. |
| 5,274,328 A | 12/1993 | Begin et al. |
| 5,278,523 A | 1/1994 | Kriz |
| 5,332,966 A | 7/1994 | Berberich |
| 5,351,003 A | 9/1994 | Bauer et al. |
| 5,545,983 A | 8/1996 | Okeya et al. |
| 5,574,366 A | 11/1996 | Joost |
| 5,589,768 A | 12/1996 | Ishiyama et al. |
| 5,608,318 A | 3/1997 | Yasui |
| 6,246,229 B1 | 6/2001 | Slates |

*Primary Examiner*—Jay M. Patidar
(74) *Attorney, Agent, or Firm*—Armstrong Teasdale LLP

(57) ABSTRACT

Methods and systems a method of assembling a proximity probe are provided. The method includes determining a coil wire dimension and coil geometry for the probe such that a resistance versus temperature profile of the coil is approximately constant when the coil is excited with an excitation frequency of approximately 150 kilohertz to approximately 350 kilohertz, and adjusting the coil geometry such that a resistance versus temperature profile of the coil is substantially constant.

20 Claims, 3 Drawing Sheets

300

```
┌─────────────────────────────────────────────┐
│ DETERMINING A COIL WIRE DIMENSION AND COIL  │
│   GEOMETRY FOR THE PROBE SUCH THAT A        │
│ RESISTANCE VERSUS TEMPERATURE PROFILE OF    │
│  THE COIL IS APPROXIMATELY CONSTANT WHEN    │─ 302
│         THE COIL IS EXCITED WITH AN EXCITATION │
│    FREQUENCY OF APPROXIMATELY 150 KILOHERTZ │
│         TO APPROXIMATELY 350 KILOHERTZ      │
└─────────────────────────────────────────────┘
                       │
                       ▼
┌─────────────────────────────────────────────┐
│     ADJUSTING THE COIL GEOMETRY SUCH THAT A │
│  RESISTANCE VERSUS TEMPERATURE PROFILE OF   │─ 304
│       THE COIL IS SUBSTANTIALLY CONSTANT    │
└─────────────────────────────────────────────┘
```

Figure 3

METHODS AND SYSTEMS FOR CONTROLLING THE TEMPERATURE STABILITY OF AN INDUCTOR

BACKGROUND OF THE INVENTION

This invention relates generally to controlling the temperature stability of an inductor, and more particularly to methods and apparatus for controlling the temperature stability of a sensing coil of a proximity probe.

At least some known rotating and reciprocating machinery use an eddy current or proximity probe to facilitate monitoring machine vibration or rotor position characteristics. The environment that the proximity probe operates may be relatively harsh.

Typically, the proximity probe, outputs a signal correlative to a spacing between a target object such as, a rotating shaft of a machine or an outer ring of a rolling element bearing and a sensing coil of the proximity probe. The gap or spacing between the target and the sensing coil of the proximity probe needs to remain within the linear range of the proximity probe for providing accurate and reliable measurements of machine vibration characteristics. Accordingly, to provide accurate and reliable measurement, a proximity probe should remain in the linear range of operation under all operating environmental conditions.

The electronics associated with the proximity probe typically incorporates an oscillation circuit whose amplitude of oscillations is dependent on the conductance of the sensing coil. When the circuit is oscillating, the sensing coil has an alternating current flowing therein which causes the sensing coil to radiate energy in the form of an alternating magnetic field. The target object absorbs some of the radiated energy from the sensing coil when it is placed within the alternating field emanating from the sensing coil. This absorption of energy is a result of the alternating field generating eddy currents in the object which circulate so as to oppose the alternating field which created them. The amount of energy absorbed by the target object is correlative to the spacing between the target object and the sensing coil. The closer the target is to the sensing coil, the more energy the target will absorb from the sensing coil as a result of the eddy current principle. Therefore, the amplitude of oscillations of the oscillation circuit will vary as a function of spacing between the sensing coil and the target.

The ability to provide accurate and reliable measurements over a wide range of circuit and environmental conditions is dependent, at least partially on, the characteristics of the sensing coil including the material and diameter of the wire used to wind the coil, the operating frequency of the system and the electronics of the proximity probe system. The sensing coil and the remaining electronics usually have a wide range of tolerances, such as gain, bias voltage, bias current and temperature coefficients. Accordingly, each production unit has to be initially calibrated to incorporate those tolerances. Moreover, the sensing coil of the proximity probe usually contains sources of temperature drift error which are attempted to be compensated for in the final product.

A source of the temperature drift error in the sensing coil is due to a temperature dependent resistance of the coil and an inductance of the coil. This temperature dependent resistance and inductance of the sensing coil effects a source of temperature drift error resulting in inaccurate proximity probe measurements as a consequence of the false appearance of a gap change between the target and sensing coil. Such inconsistencies in temperature stability of the proximity probe result in unpredictable and unreliable measurements even when the proximity probe is functioning in its linear range of operation. Compensation for such inconsistencies is usually only partially effective to facilitate temperature dependent errors.

BRIEF DESCRIPTION OF THE INVENTION

In one embodiment, a method of assembling a proximity probe includes determining a coil wire dimension and coil geometry for the probe such that a resistance versus temperature profile of the coil is approximately constant when the coil is excited with an excitation frequency of approximately 150 kilohertz to approximately 350 kilohertz, and adjusting the coil geometry such that a resistance versus temperature profile of the coil is substantially constant.

In another embodiment, a proximity probe configured to monitor a rotatable machine by measuring a gap between the probe and a target associated with the rotatable machine includes a coil configured to be located magnetically proximate the target on a first side of the coil, said coil comprising a coil wire dimension and coil geometry for the probe such that a resistance versus temperature profile of the coil is approximately constant when the coil is excited with an excitation frequency of approximately 150 kilohertz to approximately 350 kilohertz and a tuning disk positioned proximate a second opposite side of the coil wherein a distance between the first coil and tuning disk is changeable to generate a predetermined scale factor for the coil.

In yet another embodiment, a system for determining a gap defined between an eddy current proximity probe and a target includes a proximity probe including a coil configured to be located magnetically proximate the target on a first side of the coil such that an output signal correlative to a distance between the proximity probe and the target, said coil comprising a coil wire dimension and a coil geometry for the probe such that a resistance versus temperature profile of the coil is approximately constant when the coil is excited with an excitation frequency of approximately 150 kilohertz to approximately 350 kilohertz, and a tuning disk positioned proximate a second opposite side of the coil wherein a distance between the first coil and tuning disk is changeable to generate a predetermined scale factor for the coil. The system also includes an electronic circuit coupled to the proximity probe configured to transmit an excitation frequency to the proximity probe and to receive the output signal from the proximity probe.

BRIEF DESCRIPTION OF THE DRAWINGS

FIG. 3 is a flow chart of an exemplary method of assembling the proximity probe shown in FIG. 2.

DETAILED DESCRIPTION OF THE INVENTION

Figure 1:
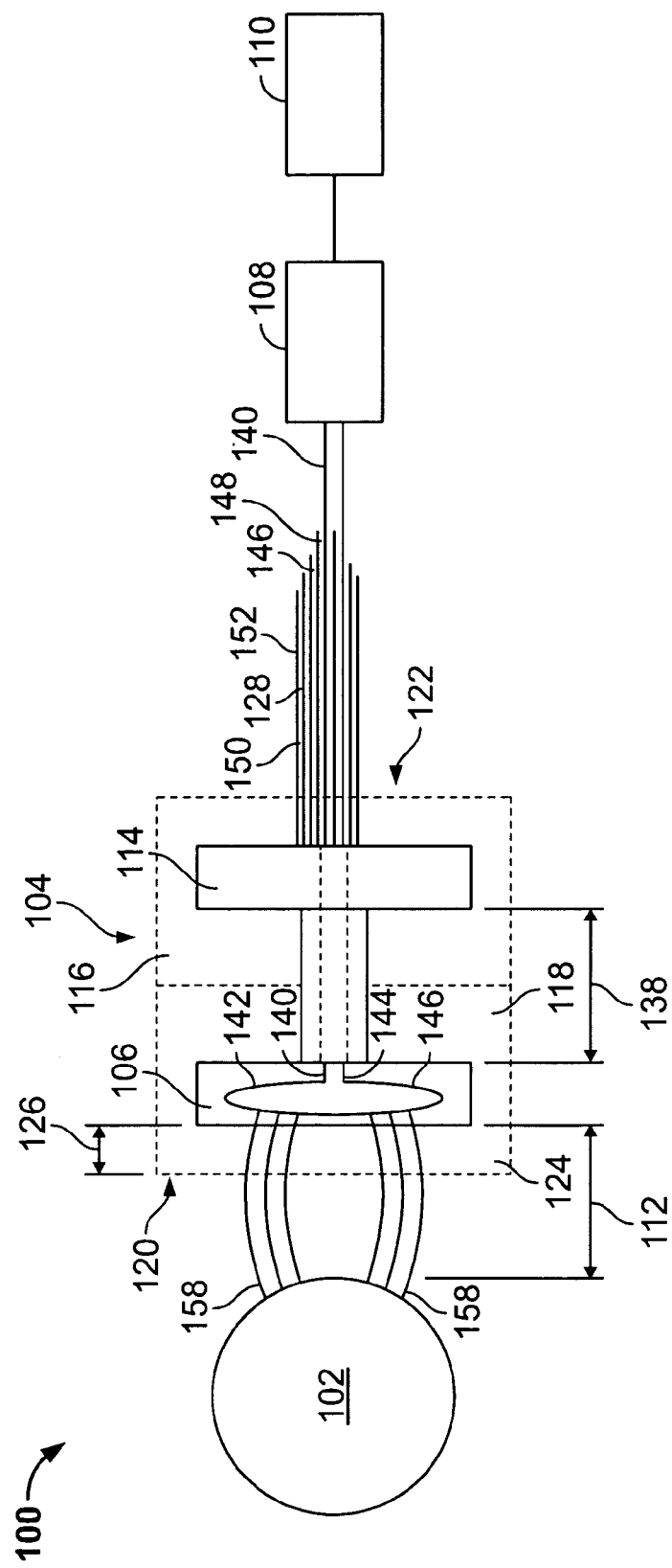
FIG. 1 is a schematic view of a proximity probe system.

FIG. 1 is a schematic view of a proximity probe system 100. Proximity probe system 100 is configured to monitor a target object, for example, a rotating shaft 102 of a machine (not shown). Proximity probe system 100 includes a proximity probe 104 including a temperature stable inductor 106, an electronic circuit 108 and a monitoring system 110. Typically, proximity probe 104 is operatively coupled to electronic circuit 108 and is positioned adjacent rotating shaft 102 for monitoring the vibrational or rotor position characteristics thereof. Proximity probe 104 uses eddy currents to generate a signal indicative of a gap 112 between rotating shaft 102 and inductor 106. Proximity probe 104 includes a tuning disk 114 magnetically coupled to inductor 106 for setting a scale range for the output of proximity probe 104.

Proximity probe 104 defines a common enclosure 116 housing both inductor 106 and tuning disk 114. In the exemplary embodiment, proximity probe 104 is formed from a cured monolith of molded material 118 defining an encapsulation having a front end 120 and a back end 122. Inductor 106 is generally symmetrically positioned within proximity probe 104. An integrally formed protective probe tip 124 of a substantially uniform thickness 126 is fabricated along a forwardmost portion of proximity probe 104. Molded material 118 substantially surrounds inductor 106 proximate front end 120 and ensconces a portion of an electrical conduit 128 that emanates from back end 122. Tuning disk 114 is adjustable such that a distance 138 between inductor 106 and tuning disk 114 may be selected and maintained to facilitate controlling the output characteristics of proximity probe 104.

In the exemplary embodiment, electrical conduit 128 comprises a multi-axis cable including a center conductor 140 electrically connected to a first lead 142 of inductor 106 and a coaxial conductor 144 electrically connected to a second lead 146 of inductor 106 wherein the center conductor 72 and coaxial conductor 74 are separated by an insulator or dielectric 148. In the exemplary embodiment, a braided sheath 150 circumscribes coaxial conductor 144 and is separated therefrom by an insulator 152. Braided sheath 150 provides additional shielding and mechanical integrity to electrical conduit 128. Electrical conduit 128 extends out of the back end 116 of the encapsulation 118 and couples inductor 106 to electronic circuit 108 to provide signal output and power input therebetween.

Electronic circuit 108 is operatively coupled to inductor 106 for radiating energy in the form of an alternating magnetic field 158 from inductor 106 to rotating shaft 102 and for receiving signals from inductor 106. Rotating shaft 102 absorbs some of this radiated energy and the received signals by electronic circuit 108, from inductor 106, are a function of the spacing between rotating shaft 102 and inductor 106. Thus, the closer rotating shaft 102 is to inductor 106, the more energy rotating shaft 102 will absorb as a result of the eddy currents induced in rotating shaft 102.

Specifically, the absorption of the radiated energy by shaft 102 is a result of the alternating magnetic field 158 generating eddy currents in shaft 102 which circulate so as to oppose magnetic field 158, which created them. This action causes the resistance of the coil to change. In addition, the mutual effect of the currents in the closely adjacent conductors, turns of inductor 106, produce a temperature dependent change in resistance in response to the alternating current. Thus, the mutual effect of the currents in the closely adjacent turns of inductor 106 and the effect of the currents in shaft 102 produce temperature drift and gain variations in response to the alternating current. In the exemplary embodiment, dimensions of inductor 106 and the wire comprising inductor 106 are preselected based on system performance requirements and the environment where proximity probe 104 is to operate. For example, a distance 112 may determine a diameter of proximity probe 104 and inductor 106. A system operating frequency is determined based on the dimensions of inductor 106 and the dimensions and electrical characteristics of the wire used to form inductor 106. The system operates at a specified frequency in order to provide an acceptable level of temperature stability. This frequency is theoretically determined, for example, using a computer programmed to determine the frequency based on the wire composition, diameter, and the geometrical configuration of the coil windings. This provides a baseline frequency at which the system will operate. The system is tested iteratively over its operating temperature range to determine the optimal operating frequency. In the exemplary embodiment, the eddy current system is temperature stable when operating at a frequency between 150 kilohertz and 350 kilohertz. Specifically, for a 50 millimeter diameter probe configured as described herein the system is temperature stable when operating at a frequency of approximately 267 kilohertz.

Using the determined frequency, a linearly of a resistance versus temperature curve is determined empirically. To improve the linearity of the resistance versus temperature curve over the desired range, the inductance of inductor 106 is adjusted, for example, by adding or removing winding turns to inductor 106 such that temperature drift and gain variations generated by both inductor 106 and target object (i.e., shaft 102) for effecting the temperature stable inductor 10 are substantially canceled out which results in a temperature stable proximity probe 104. Thus, the temperature compensated proximity probe maintains an accurate indication of the gap 112 between rotating shaft 102 and inductor 106 under the temperature variations found in the environment of machine monitoring.

Figure 2:
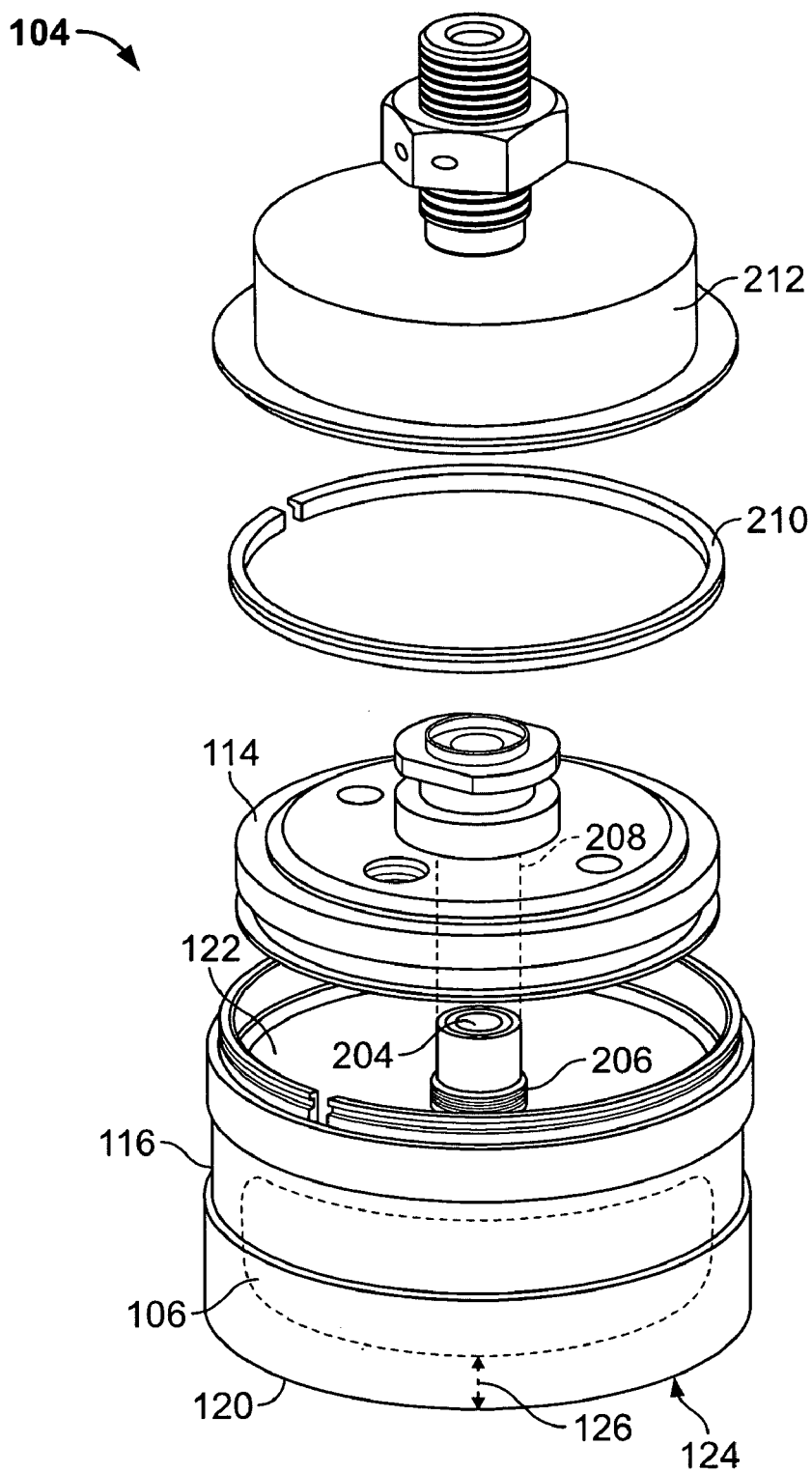
FIG. 2 is an exploded perspective view of an exemplary proximity probe in accordance with an embodiment of the present invention.

FIG. 2 is an exploded perspective view of an exemplary proximity probe 104 in accordance with an embodiment of the present invention. Proximity probe 104 includes common enclosure 116 housing inductor 106 and tuning disk 114. In the exemplary embodiment, proximity probe 104 is formed from molded material 118 defining an encapsulation having a front end 120 and a back end 122. Inductor 106 is generally symmetrically positioned within proximity probe 104. An integrally formed protective probe tip 124 of a substantially uniform thickness 126 is fabricated along a forwardmost portion of proximity probe 104. Molded material 118 substantially surrounds inductor 106 proximate front end 120. A feed through boss 202 extends from back end 122 to guide and protect electrical conduit 128 (not shown in FIG. 2) from inductor 106. Boss 202 includes a bore 204 therethough and a threaded portion 206 configured to threadably engage a threaded portion 208 of tuning disk tuning disk 114. Tuning disk tuning disk 114 is adjustable such that a distance between inductor 106 and tuning disk 114 may be selected and maintained to facilitate controlling the output characteristics of proximity probe 104. A weld ring 210 facilitates sealing a case 212 to enclosure 116.

FIG. 3 is a flow chart of an exemplary method 300 of assembling proximity probe 104 (shown in FIG. 2). The method includes determining 302 a coil wire dimension and coil geometry for the probe such that a resistance versus temperature profile of the coil is approximately constant when the coil is excited with an excitation frequency of approximately 150 kilohertz to approximately 350 kilohertz, and adjusting 304 the coil geometry such that a resistance versus temperature profile of the coil is substantially constant.

The coil geometry is selected based on an application for the proximity probe. In the exemplary embodiment, a fifty millimeter diameter probe is selected. Selecting the coil geometry also includes selecting a wire diameter and material. An excitation to be applied to the probe during operation is determined using for example, a computer-based algorithm that determines a frequency of operation that facilitates reducing a temperature dependence of the output of the probe. In the exemplary embodiment, the algorithm uses the selected coil geometry and the coil wire dimensions and electrical characteristics to determine an operating frequency between approximately 150 kilohertz to approximately 350 kilohertz. The coil is subjected to output tests at various gap distances between the coil and a target. In one such test, the ambient temperature of the probe is varied between temperature extremes expected to be experienced in the particular application the probe will be used in. The coil geometry is iteratively adjusted to attain a resistance versus temperature profile of the coil is substantially constant. For example, coil turns are added or removed to control the coil inductance such that the excitation frequency changes correlatively. In the exemplary embodiment, an operating frequency of approximately 267 kilohertz is the final operating frequency. Additionally, a tuning disk comprising, in the exemplary embodiment, a stainless steel disk is positioned on an opposite side of the coil from the target. The tuning disk is magnetically coupled to the coil when an excitation signal is applied to the coil. The tuning disk is threadably coupled to a boss extending from the side of the coil enclosure. The scale factor of the coil is controlled by threading the tuning disk closer to the coil or further away from the coil. When the output scale factor is determined to be at the predetermined value, the tuning disk is locked in place and the proximity probe is further assembled.

The above-described embodiments of temperature stable proximity probe system provides a cost-effective and reliable means for monitoring machinery. More specifically, the coil of the proximity probe is fabricated such that an operating frequency is selected that substantially mitigates a temperature dependence of the output of the coil. As a result, an proximity based monitoring system is provided that facilitates improving the accuracy and repeatability of the proximity probe.

Exemplary embodiments of monitoring systems are described above in detail. The monitoring system components illustrated are not limited to the specific embodiments described herein, but rather, components of each monitoring system may be utilized independently and separately from other components described herein. For example, the monitoring system components described above may also be used in combination with other monitoring system.

While the invention has been described in terms of various specific embodiments, those skilled in the art will recognize that the invention can be practiced with modification within the spirit and scope of the claims.

What is claimed is:

1. A method of assembling a proximity probe including a coil, said method comprising:
   determining a coil wire dimension and coil geometry for the probe such that a resistance versus temperature profile of the coil is approximately constant when the coil is excited with an excitation frequency of approximately 150 kilohertz to approximately 350 kilohertz; and
   adjusting the coil geometry such that a resistance versus temperature profile of the coil is substantially constant.

2. A method in accordance with claim 1 wherein determining a coil wire dimension and coil geometry comprises determining a coil wire dimension and coil geometry for the probe such that a resistance versus temperature profile of the coil is approximately constant when the coil is excited with an excitation frequency of approximately 267 kilohertz.

3. A method in accordance with claim 1 wherein determining a coil wire dimension and coil geometry comprises selecting a coil geometry based on a distance range between the proximity probe and a target during operation.

4. A method in accordance with claim 1 wherein determining a coil wire dimension and coil geometry comprises selecting a coil wire dimension and a coil diameter.

5. A method in accordance with claim 1 wherein determining a coil wire dimension and coil geometry comprises selecting a coil wire dimension and a coil diameter to be approximately fifty millimeters.

6. A method in accordance with claim 1 wherein adjusting the coil geometry comprises adjusting at least one of the coil diameter and the number of wire turns in the coil.

7. A method in accordance with claim 1 wherein adjusting the coil geometry comprises changing the number of wire turns in the coil.

8. A method in accordance with claim 1 further comprising adjusting a scale factor of the coil to a predetermined value using a tuning disk magnetically coupled with the coil.

9. A method in accordance with claim 8 further comprising adjusting a scale factor of the coil to a predetermined value by changing a distance between the tuning disk and the coil.

10. A proximity probe configured to monitor a rotatable machine by measuring a gap between said probe and a target associated with the rotatable machine, said proximity probe comprising:
    a coil configured to be located magnetically proximate the target on a first side of the coil, said coil comprising a coil wire dimension and coil geometry for the probe such that a resistance versus temperature profile of the coil is approximately constant when the coil is excited with an excitation frequency of approximately 150 kilohertz to approximately 350 kilohertz; and
    a tuning disk positioned proximate a second opposite side of the coil;
    wherein a distance between said first coil and tuning disk is changeable to generate a predetermined scale factor for the coil.

11. A proximity probe in accordance with claim 10 wherein said coil comprises a coil wire dimension and coil geometry for the probe such that a resistance versus temperature profile of the coil is approximately constant when the coil is excited with an excitation frequency of approximately 267 kilohertz.

12. A proximity probe in accordance with claim 10 wherein said coil includes a DC wire resistance and a proximity effect wire resistance resulting in a temperature dependent series resistance.

13. A proximity probe in accordance with claim 12 wherein said coil comprises a plurality of turns of wire and a geometry configured to facilitate reducing the temperature dependence of the coil when operated at a predetermined frequency.

14. A proximity probe in accordance with claim 10 wherein said coil comprises a plurality of turns of wire and a geometry based on a distance range between the proximity probe and a target during operation.

15. A proximity probe in accordance with claim 10 wherein said coil comprises a coil diameter of approximately fifty millimeters.

16. A system for determining a gap defined between an eddy current proximity probe and a target, said system comprising:

a proximity probe comprising:
  a coil configured to be located magnetically proximate the target on a first side of the coil such that an output signal correlative to a distance between the proximity probe and the target, said coil comprising a coil wire dimension and a coil geometry for the probe such that a resistance versus temperature profile of the coil is approximately constant when the coil is excited with an excitation frequency of approximately 150 kilohertz to approximately 350 kilohertz; and
  a tuning disk positioned proximate a second opposite side of the coil wherein a distance between said first coil and tuning disk is changeable to generate a predetermined scale factor for the coil; and
an electronic circuit coupled to said proximity probe configured to transmit an excitation frequency to said proximity probe and to receive the output signal from said proximity probe.

17. A system in accordance with claim 16 wherein said coil comprises a coil wire dimension and a coil geometry for the probe such that a resistance versus temperature profile of the coil is approximately constant when the coil is excited with an excitation frequency of approximately 267 kilohertz.

18. A system in accordance with claim 16 wherein said coil includes a DC wire resistance and a proximity effect wire resistance resulting in a temperature dependent series resistance.

19. A system in accordance with claim 18 wherein said coil comprises a plurality of turns of wire and a geometry configured to facilitate reducing the temperature dependence of the coil when operated at a predetermined frequency.

20. A system in accordance with claim 16 wherein said coil comprises a coil diameter of approximately fifty millimeters.

* * * * *